US005590451A

United States Patent [19]

Katsuumi et al.

[11] Patent Number: 5,590,451

[45] Date of Patent: Jan. 7, 1997

[54] MANUFACTURING METHOD FOR INK JET PRINTER HEAD

[75] Inventors: Kazushige Katsuumi, Shizuoka; Toshio Miyazawa, Mishima; Toshihiro Tsukamoto, Gotenba, all of Japan

[73] Assignees: Kabushiki Kaisha TEC, Shizuoka; Toshiba-Emi Limited, Tokyo, both of Japan

[21] Appl. No.: 586,073

[22] Filed: Jan. 16, 1996

[30] Foreign Application Priority Data

Jan. 31, 1995 [JP] Japan .................................... 7-014139
Dec. 15, 1995 [JP] Japan .................................... 7-327132

[51] Int. Cl.[6] .................................................... H01L 41/22

[52] U.S. Cl. ........................ 29/25.35; 29/890.1; 310/333; 347/71

[58] Field of Search ................................ 29/25.35, 890.1; 205/127, 300, 301; 310/333, 345, 363, 364; 347/68, 71, 72; 427/100, 125, 126.5

[56] References Cited

U.S. PATENT DOCUMENTS

| | | | |
|---|---|---|---|
| 5,301,404 | 4/1994 | Ochiai et al. | 29/25.35 |
| 5,311,218 | 5/1994 | Ochiai et al. | 347/71 |
| 5,311,219 | 5/1994 | Ochiai et al. | 310/333 X |
| 5,327,627 | 7/1994 | Ochiai et al. | 29/890.1 X |

FOREIGN PATENT DOCUMENTS

| | | | |
|---|---|---|---|
| 1188348 | 7/1989 | Japan | 29/890.1 |
| 1188349 | 7/1989 | Japan | 29/890.1 |
| 4-363250 | 12/1992 | Japan . | |
| 5000513 | 1/1993 | Japan | 29/890.1 |
| 5-96727 | 4/1993 | Japan . | |
| 5147215 | 6/1993 | Japan | 29/25.35 |
| 5-269994 | 10/1993 | Japan . | |
| 5269995 | 10/1993 | Japan | 347/71 |

*Primary Examiner*—Peter Vo
*Attorney, Agent, or Firm*—Oblon, Spivak, McClelland, Maier & Neustadt, P.C.

[57] ABSTRACT

A manufacturing method for an ink jet printer head, includes the steps of cutting a plurality of channels for forming a plurality of ink chambers, on the upper surface of a substrate including at least one piezoelectric member polarized across its thickness; adsorbing Sn on the upper surface of the substrate including the inner surfaces of the channels; forming a pattern resist film on the upper surface of the substrate on which the Sn has been absorbed adsorbing Pd as a catalyst core for electroless plating on the electrode forming portions and the wiring pattern forming portions; separating the pattern resist film; immersing the substrate from which the pattern resist film has been separated into a plating liquid to deposit plating on the electrode forming portions and the wiring pattern forming portions; and mounting on the substrate a top plate for covering upper openings of the channels and a nozzle plate for covering front openings of the channels to form the above ink chambers.

10 Claims, 9 Drawing Sheets

MANUFACTURING METHOD FOR INK JET PRINTER HEAD

BACKGROUND OF THE INVENTION

1. Field of the Invention

The present invention relates to a manufacturing method for an ink jet printer head of an on-demand type such that ink droplets are discharged by utilizing deformation of a piezoelectric member, and more particularly to such a manufacturing method characterized in pretreatment for formation of electrodes and wiring patterns thereof for applying electric power to the piezoelectric member.

2. Description of the Prior Art

Conventionally known are various ink jet printer heads of a so-called on-demand type such that ink droplets are discharged in accordance with a print command. A known example of such ink jet printer heads is one designed to discharge ink droplets by utilizing deformation of a piezoelectric member upon application of electric power thereto. Such an ink jet printer head is disclosed in Japanese Patent Laid-open No. Hei 4-363250 (corresponding to U.S. Pat. No. 5,311,218), Japanese Patent Laid-open No. Hei 5-96727 (corresponding to U.S. Pat. No. 5,311,219), and Japanese Patent Laid-open No. Hei 5-269994 (corresponding to U.S. Pat. No. 5,301,404), for example. The structure of the ink jet printer head disclosed in Japanese Patent Laid-open Nos. Hei 5-96727 and Hei 5-269994 will now be described with reference to FIGS. 7(A) to 9(C) showing the sequence of steps of manufacturing the ink jet printer head.

As shown in FIG. 7(A), a substrate 4 having a three-layer structure consisting of a bottom plate 1, a lower layer 2, and a piezoelectric member 3 is formed in the first step. The bottom plate 1 is formed of a highly rigid and less thermally deformable material such as ceramics or glass. The lower layer 2 is formed by applying an adhesive primarily composed of epoxy resin to the upper surface of the bottom plate 1 to form an adhesive layer having a given thickness, and then curing the adhesive layer. The piezoelectric member 3 is bonded to the lower layer 2 in such a manner that the direction of polarization of the piezoelectric member 3 accords with the direction of thickness of the piezoelectric member 3. In forming the lower layer 2, the thickness thereof is adjusted by grinding the adhesive layer after curing it.

As shown in FIG. 7(B), the substrate 4 is next cut to form a plurality of parallel channels 5 at given intervals, each channel 5 having a depth ranging from the upper surface of the piezoelectric member 3 to the interior of the lower layer 2. By this cutting work of the substrate 4, a plurality of side walls 6 are simultaneously formed so that adjacent ones of them are located on the opposite sides of each channel 5. Each side wall 6 consists of an upper side wall 6*a* formed from the piezoelectric member 3 and a lower side wall 6*b* formed from the lower layer 2.

Next, the substrate 4 is subjected to electroless plating for forming electrodes 7 and wiring patterns 8 (see FIG. 9(A)). As a pretreatment for the electroless plating, a catalyzing/accelerating process is performed. The catalyzing process is performed by immersing the substrate 4 into a catalyst liquid containing palladium chloride ($PdCl_2$), stannous chloride ($SnCl_2$), and concentrated hydrochloric acid (HCl) to adsorb a complex compound of Pd and Sn on the inner surfaces of the channels 5 and the upper surface of the piezoelectric member 3. The accelerating process is performed to convert the complex compound adsorbed by the catalyzing process into a catalyst. By this process, the complex compound is converted into metallized Pd as a catalyst core.

As shown in FIG. 7(C), a dry film 9 is next attached to the upper surface of the piezoelectric member 3. Then, as shown in FIG. 8(A), a resist mask 10 is placed on the dry film 9 to perform exposure and development. As a result, as shown in FIG. 8(B), a pattern resist film 11 is formed on the upper surface of the piezoelectric member 3 from the dry film 9 so as to cover channel inside surfaces 7*a* as electrode forming portions on which the electrodes 7 are to be formed later and wiring pattern forming portions 8*a* on which the wiring patterns 8 are to be formed later. At this time, the metallized Pd is exposed to the channel inside surfaces 7*a* and the wiring pattern forming portions 8*a*, and the other Pd adsorbed on the upper surface of the piezoelectric member 3 is covered with the pattern resist film 11.

Next, the substrate 4 on which the pattern resist film 11 has been formed is immersed into a plating liquid to perform electroless plating. The plating liquid to be used is a low-temperature plating liquid containing nickel and phosphorus. When the substrate 4 on which the pattern resist film 11 has been formed is immersed into the plating liquid, the metallized Pd in the exposed condition acts as a catalyst core to deposit plating on the channel inside surfaces 7*a* and the wiring pattern forming portions 8*a*. As a result, the electrodes 7 are formed on the channel inside surfaces 7*a*, and the wiring patterns 8 are formed on the wiring pattern forming portions 8*a* as shown in FIG. 9(A). Then, as shown in FIG. 9(B), the pattern resist film 11 is separated to thereby finish the electroless plating.

Next, as shown in FIG. 9(C), a top plate 12 is bonded to the substrate 4 so as to cover the upper openings of the channels 5, and a nozzle plate 14 having a plurality of ink discharge openings 13 respectively communicating with the front openings of the channels 5 is then bonded to the substrate 4 and the top plate 12 so as to cover the front openings of the channels 5. Further, an ink supply pipe 15 for supplying ink to the channels 5 is mounted to the top plate 12, thereby completing an ink jet printer head 16. Thus, the channels 5 are surrounded by the top plate 12 and the nozzle plate 14 to thereby form a plurality of ink chambers. In bonding the nozzle plate 14, the front end surfaces of the substrate 4 and the top plate 12 are cut to be made flush.

In manufacturing the ink jet printer head 16 disclosed in Japanese Patent Laid-open Nos. 5-96727 and 5-269994, the electrodes 7 and the wiring patterns 8 are formed by the above-mentioned steps, in which the electrodes 7 having no pin holes can be formed on the channel inside surfaces 7*a*. However, the prior art ink jet printer head 16 has the following problems.

The first problem will now be described. In immersing the substrate 4 on which the pattern resist film 11 has been attached into the plating liquid, so as to form the electrodes 7 and the wiring patterns 8 by electroless plating, there is a case that the pattern resist film 11 is swelled by the plating liquid, and in particular, portions of the pattern resist film 11 covering the upper end surfaces of the side walls 6 are floated or separated by the plating liquid. If the pattern resist film 11 is thus floated or separated from the upper end surfaces of the side walls 6, the Pd covered with the pattern resist film 11 is exposed to act as a catalyst core for electroless plating, thereby depositing plating on the upper end surfaces of the side walls 6. As a result, the adjacent electrodes 7 formed on the channel inside surfaces 7*a* are short-circuited in some case. This defect is due to the following reason. In attaching the dry film 9 to the upper surface of the piezoelectric member 3 with good adhesion, it is desired to enough harden the dry film 9 at a baking temperature of 150° C. or higher. To the contrary, when the piezoelectric member 3 polarized is heated to 130° C. or higher, a deterioration of polarization in the piezoelectric member 3 occurs. Accordingly, the baking temperature must be suppressed to about 130° C. As a result, the pattern resist film 11 is not enough hardened because of the low baking temperature of about 130° C., causing ready swelling of the pattern resist film 11 immersed into the plating liquid.

The second problem will next be described. Just before depositing the plating by electroless plating, a hydrophilic process for the substrate 4 is usually performed with an ethanol liquid or an activating agent to improve the deposition of the plating on the channel inside surfaces 7*a*. Although not described in the prior art shown in FIGS. 7(A) to 9(C), the hydrophilic process activates the surface of the pattern resist film 11. However, when the hydrophilic process is performed, there is a case that the Pd adsorbed on the channel inside surfaces 7*a* and the wiring pattern forming portions 8*a* is partially separated and the Pd thus separated is partially deposited to the activated surface of the pattern resist film 11. As a result, when the substrate 4 in this condition is immersed into the plating liquid to deposit the plating, the plating is undesirably deposited also to the surface of the pattern resist film 11 on which the plating must not be deposited, so that the plating deposited on the surface of the pattern resist film 11 continues to the electrodes 7 and the wiring patterns 8. Accordingly, in separating the pattern resist film 11, the electrodes 7 and the wiring patterns 8 are partially pulled to be separated in some case.

The third problem will next be described. To solve the above two problems, it is considered to adopt a known method as one of manufacturing methods for an electric substrate, that is, to perform a pretreatment for electroless plating after forming the pattern resist film 11 and then immerse the substrate 4 into the plating liquid to deposit the plating after separating the pattern resist film 11. According to this method, however, it is difficult to deposit the plating for forming the electrodes 7 and the wiring patterns 8 having a microscopic structure as required in the ink jet printer head 16. That is, after forming the pattern resist film 11, the surface of the piezoelectric member 3 covered with the pattern resist film 11 is difficult to make hydrophilic. Accordingly, in performing the pretreatment for electroless plating, a pretreatment liquid cannot easily enter the channel inside surfaces 7*a* and the wiring pattern forming portions 8*a* having the microscopic structure, so that a catalyst core cannot easily be adsorbed on the channel inside surfaces 7*a* and the wiring pattern forming portions 8*a*.

SUMMARY OF THE INVENTION

It is accordingly an object of the present invention to provide a manufacturing method for an ink jet printer head which can manufacture electrodes and wiring patterns with a high accuracy by electroless plating.

It is another object of the present invention to provide a manufacturing method for an ink jet printer head which can manufacture electrodes and wiring patterns with a high density by electroless plating.

The manufacturing method for the ink jet printer head according to the present invention comprises the steps of forming a substrate composed of a plurality of layers including at least one piezoelectric member polarized across its thickness; forming a plurality of parallel channels and a plurality of side walls isolating the channels at given intervals, from an upper surface of the substrate, at least a part of each of the side walls being formed from the piezoelectric member; adsorbing Sn on the upper surface of the substrate including inner surfaces of the channels; forming a pattern resist film on the upper surface of the substrate on which the Sn has been adsorbed so that the pattern resist film covers a portion of the upper surface of the substrate except electrode forming portions on the inner surfaces of the channels and wiring pattern forming portions on the substrate; adsorbing Pd as a catalyst core for electroless plating on the electrode forming portions and the wiring pattern forming portions, for example, by substituting Ag for the Sn and then substituting Pd for the Ag; separating the pattern resist film; immersing the substrate from which the pattern resist film has been separated into a plating liquid to deposit plating on the electrode forming portions and the wiring pattern forming portions, thereby forming electrodes and wiring patterns; and mounting on the substrate a top plate for covering upper openings of the channels and a nozzle plate for covering front openings of the channels to form a plurality of ink chambers. According to this method, Sn is preliminarily adsorbed on the electrode forming portions and the wiring pattern forming portions to which Pd is to be adsorbed later in the pretreatment step for electroless plating. Accordingly, although the electrode forming portions and the wiring pattern forming portions are microscopic portions surrounded by the pattern resist film, a pretreatment liquid is allowed to easily enter the electrode forming portions and the wiring pattern forming portions, thereby effecting good adsorption of Pd. As a result, the electrodes and the wiring patterns can be well formed by the deposition of plating with the Pd acting as a catalyst core. Further, the substrate is immersed into the plating liquid to perform electroless plating after separating the pattern resist film. Accordingly, there is no possibility of swelling of the pattern resist film and separation of the pattern resist film swelled due to the immersion of the substrate into the plating liquid. As a result, the electrodes and the wiring patterns can be formed with a high accuracy. Further, in depositing the plating, the Pd as a catalyst core is preliminarily adsorbed only at the electrode forming portions and the wiring pattern forming portions, and the plating is deposited only at the electrode forming portions and the wiring pattern forming portions. Accordingly, there is no possibility that the plating may be deposited between the adjacent electrodes to cause short-circuit. Thus, the electrodes and the wiring patterns can be formed with a high accuracy. Further, even if the Pd adsorbed on the electrode forming portions and the wiring pattern forming portions is partially separated off in performing a hydrophilic treatment just before immersing the substrate into a resist separating liquid to separate the pattern resist film or immersing the substrate from which the pattern resist film has been separated into the plating liquid, there is no possibility that the Pd separated off may be adsorbed to the surface of the Sn layer on the substrate, because the surface of the Sn layer is not activated. Accordingly, there is no possibility that the plating may be deposited on any portion of the substrate other than the electrode forming portions and the wiring pattern forming portions on which the Pd is previously deposited. As a result, the possibility of short-circuit due to deposition of plating between the adjacent electrodes can be prevented to thereby effect high-accuracy formation of the electrodes and the wiring patterns.

DETAILED DESCRIPTION OF THE PREFERRED EMBODIMENTS

Figure 1:
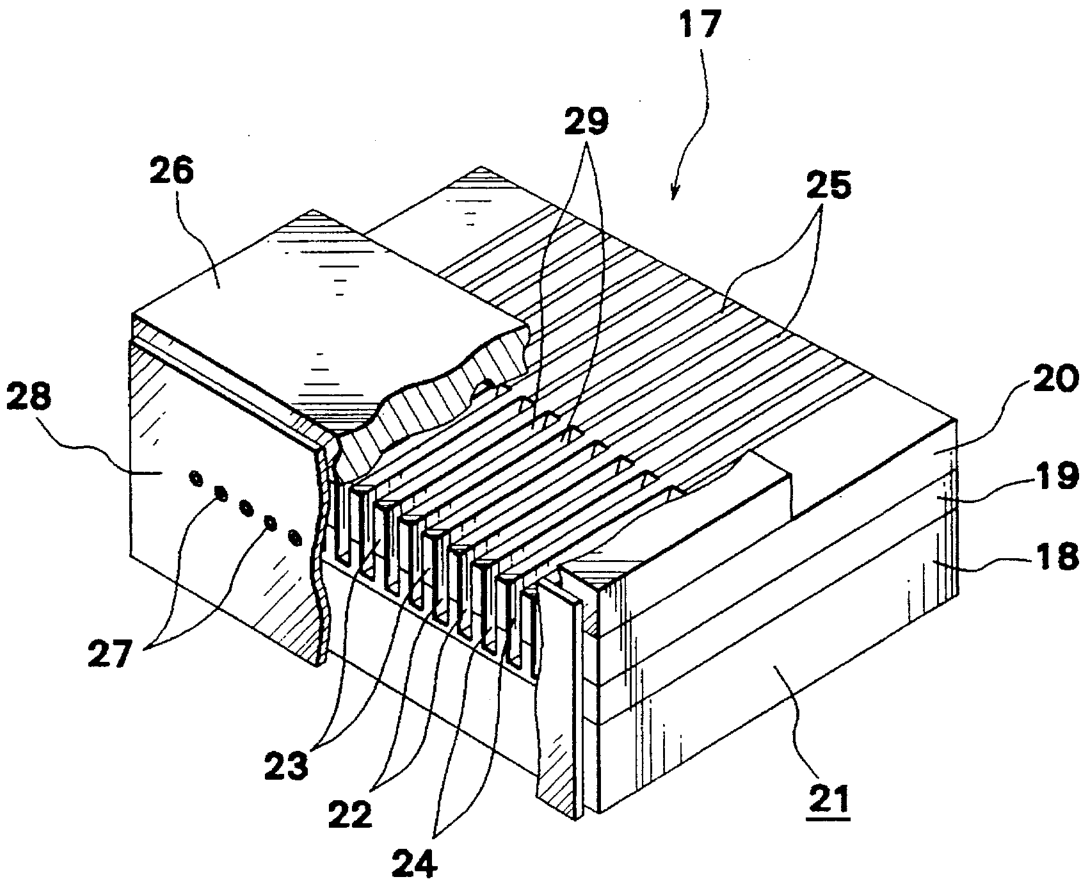
FIG. 1 is a partially cutaway, perspective view of an ink jet printer head according to a first preferred embodiment of the present invention.

A first preferred embodiment of the present invention will now be described with reference to FIGS. 1 to 4(C). FIG. 1 is a partially cutaway, perspective view showing the structure of the whole of an ink jet printer head 17 according to the present invention. The ink jet printer head 17 includes a substrate 21 formed by bonding two layers of piezoelectric members 19 and 20 on a bottom plate 18. The substrate 21 includes a plurality of channels 22 and side walls 23 adjacent ones of which are located on the opposite sides of each channel 22. The channels 22 and the side walls 23 are formed by cutting the substrate 21. A plurality of electrodes 24 and a plurality of wiring patterns 25 are formed on the substrate 21 having the channels 22 and the side walls 23 by electroless plating. A top plate 26 and a nozzle plate 28 having a plurality of ink discharge openings 27 are bonded to the substrate 21 after forming the electrodes 24 and the wiring patterns 25. Thus, the channels 22 are surrounded by the top plate 26 and the nozzle plate 28 to thereby form a plurality of ink chambers 29.

Figure 2A:
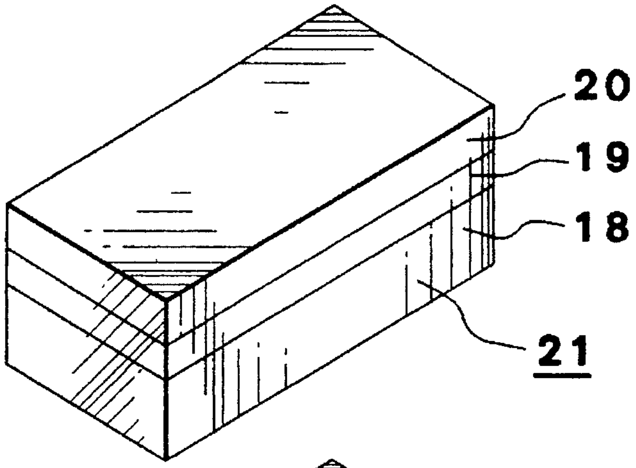
FIG. 2(A) is a perspective view of a substrate.

The structure of the ink jet printer head 17 will now be described in detail with reference to FIGS. 2(A) to 4(C) showing the sequence of steps of manufacturing the ink jet printer head 17. As shown in FIG. 2(A), the two layers of piezoelectric members 19 and 20 are bonded to the upper surface of the bottom plate 18 to form the substrate 21 having a three-layer structure. The bottom plate 18 is formed of a highly rigid and less thermally deformable material such as ceramics or glass. The piezoelectric members 19 and 20 are preliminarily polarized across their thickness, and they are bonded together in such a manner that the directions of polarization of them are opposite to each other.

Figure 2B:
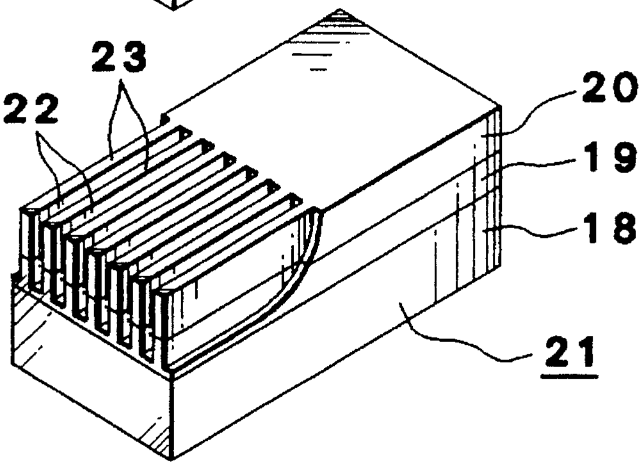
FIG. 2(B) is a perspective view showing a condition where the substrate is cut to form channels.

As shown in FIG. 2(B), the substrate 21 is cut to form the plural channels 22 each having a depth ranging from the upper surface of the piezoelectric member 20 to the interior of the piezoelectric member 19 and resultantly form the plural side walls 23 adjacent ones of which are located on the opposite sides of each channel 22. The cutting work of the substrate 21 is performed by using a diamond wheel of a dicing saw for use in cutting an IC wafer, for example.

The dimensions of the substrate 21 are such that the thicknesses of the bottom plate 18, the lower piezoelectric member 19, and the upper piezoelectric member 20 were set to 1.4 mm, 175 μm, and 130 μm, respectively, and the thickness of an adhesive layer between the piezoelectric members 19 and 20 was set to 10 μm. The dimensions of each channel 22 are such that the width and the depth of each channel 22 were set to 70 μm and 270 μm, respectively. The nozzle plate 28 is formed by electroforming of nickel, and a film of fluorine resin having good repellency against ink is formed on only the front surface of the nozzle plate 28.

A test on electrode forming steps was made to determine a condition of deposition of plating by electroless plating and an efficient step for the deposition of plating in forming the electrodes 24 and the wiring patterns 25. The results of this test are shown in Table 1.

Table 1 Experimental Results of Forming Electrode

Sample 1 was prepared by subjecting a solid substrate of piezoelectric members to electroless plating. That is, electroless plating was performed after washing the substrate, performing the sensitizing process, and performing activation process. The deposition of plating was "good".

Sample 2 and Sample 3 were prepared by subjecting the substrate 21 formed with the channels 22 and the side walls 23 to electroless plating. That is, electroless plating was performed after washing the substrate 21, attaching a dry

TABLE 1

Experimental results of forming electrodes (width of wiring patterns = 70 μm)

| steps | runs sample 1 (solid) | 2 | 3 | 4 | 5 (solid) | 6 | 7 | 8 | 9 | 10 | 11 |
|---|---|---|---|---|---|---|---|---|---|---|---|
| 1 substrate washing | ● | ● | ● | ● | ● | ● | ● | ● | ● | ● | ● |
| 2 substrate drying | | ● | ● | ● | ● | ● | ● | ● | | | |
| 3 Sn adsorbing | | | | | | | | | ● | ● | ● |
| 4 Ag adsorbing | | | | | | | | | | | ● |
| 5 substrate drying | | | | | | | | | ● | ● | ● |
| 6 silazane treatment OAP | | | ● | ● | | ● | ● | ● | ● | ● | ● |
| 7 dry film attachment | | ● | ● | ● | | ● | ● | ● | ● | ● | ● |
| 8 exposure | | ● | ● | ● | ● | ● | ● | ● | ● | ● | ● |
| 9 development by sodium carbonate (90 sec) | | ● | ● | ● | ● | ● | ● | ● | ● | ● | ● |
| 10 substrate washing only by flowing water | | ● | ● | ● | ● | | | | ● | ● | ● |
| 11 surface adjustment OPC 60° C. | | | | ● | ● | | | | | | |
| 12 plating pretreatment Sn sensitizing | ● | ● | ● | ● | ● | ● | ● | ● | ● | | |
| 13 plating pretreatment Ag activation | ● | ● | ● | ● | ● | ● | ● | ● | ● | ● | |
| 14 plating pretreatment Pd activation | ● | ● | ● | ● | ● | ● | ● | ● | ● | ● | ● |
| 15 pattern resist film separation NaOH (1) | | ● | ● | ● | ● | ● | ● | ● | ● | ● | ● |
| 16 pattern resist film separation NaOH (2) | | | | | | | ● | ● | | | |
| 17 pattern resist film separation NaOH (3) | | | | | | | | ● | | | |
| 18 pickling with sulfuric acid | | ● | ● | ● | ● | ● | ● | ● | ● | ● | ● |
| 19 plating | ● | ● | ● | ● | ● | ● | ● | ● | ● | ● | ● |
| 20 plating evaluation | O | X | X | X | O | X | X | X | O | O | ◎ |

plating evaluation:
X not deposited
O good
◎ very good

All the samples except Sample 1 and Sample 5 in the test were prepared by using the same substrate as the substrate 21 formed with the channels 22. Sample 1 and Sample 5 were prepared by using the substrate having not yet been formed with the channels 22. While a pretreatment process for electroless plating is known as a catalyzing/accelerating process and a sensitizing/activation process, the present invention adopts the sensitizing/activation process. The sensitizing process is a process of immersing the substrate into a sensitizing liquid as a pretreatment liquid to thereby adsorb Sn on the substrate, whereas the activation process consists of a first stage of process of immersing the Sn adsorbed substrate in a pretreatment liquid containing silver nitrate ($AgNO_3$) to thereby substitute Ag for the Sn adsorbed on the substrate and a second stage of process of immersing the Ag adsorbed substrate in a pretreatment liquid containing palladium chloride ($PdCl_2$) to thereby substitute Pd as a catalyst core for the Ag.

film to the upper surface of the upper piezoelectric member of the substrate 21, forming a pattern resist film by performing exposure and development with a resist mask to the dry film, performing the sensitizing process, performing the activation process, and separating the pattern resist film by immersing the substrate 21 into a resist separating liquid. In particular, an addition step in preparing Sample 3 was a silazane treatment performed prior to attachment of the dry film to improve the adhesion between the substrate 21 and the dry film, thereby improving the accuracy of pattern dimensions in forming the pattern resist film. However, no plating was deposited in both Sample 2 and Sample 3.

An additional step in preparing Sample 4 in contrast with Sample 3 was a surface adjusting treatment for activating the surface of the piezoelectric members after forming the pattern resist film to thereby facilitate the penetration of the pretreatment liquid. However, no plating was deposited.

Sample 5 was prepared for the purpose of examining the influence of the dry film. That is, electroless plating was performed to the solid substrate with no dry film attached thereto after exposure, development, sensitizing process, activation process, and immersion of the solid substrate into the resist separating liquid. The deposition of plating was "good".

The test results from Sample 1 to Sample 5 have proved that the attachment of the dry film and the separation of the pattern resist film (the immersion into the resist separating liquid) cause no deposition of plating.

Then, Sample 6 to Sample 8 were prepared on the assumption that no deposition of plating was caused by the phenomenon that the dry film dissolved into the resist separating liquid in the step of separating the pattern resist film was redeposited to the electrode forming portions and the wiring pattern forming portions at which Pd as a catalyst core had already been adsorbed, thereby covering the Pd. That is, Samples 6, 7, and 8 were prepared by performing the step of immersing the substrate with the pattern resist film into the resist separating liquid in one stage, two stages, and three stages, respectively, so as to prevent the redeposition of the dry film dissolved in the resist separating liquid. However, no plating was deposited in all of Samples 6 to 8.

Sample 9 was prepared by performing electroless plating after washing the substrate, adsorbing Sn on the whole surface of the substrate, attaching the dry film, forming the pattern resist film, performing the sensitizing process and the activation process, and separating the pattern resist film. The deposition of plating at the electrode forming portions and the wiring pattern forming portions having a microscopic structure was "good". This result is due to the fact that the adsorption of Sn on the whole surface of the substrate in the first stage allows smooth reaction with the pretreatment liquid in performing the pretreatment for electroless plating at the microscopic electrode forming portions and wiring pattern forming portions, thereby improving the adsorption of Pd as a catalyst core.

Sample 10 was prepared by substantially the same process as that of Sample 9 except that the sensitizing process was omitted. Also in Sample 10, the deposition of plating was "good" as similar to Sample 9.

Sample 11 was prepared by performing electroless plating after washing the substrate, adsorbing Sn on the whole surface of the substrate, substituting Ag for the Sn, attaching the dry film, forming the pattern resist film, performing the activation process, and separating the pattern resist film. The deposition of plating was "very good".

As mentioned above, the test results from all the samples are those in the case that the width of each channel 22, that is, the wiring pattern width of the pattern resist film was set to 70 μm. However, in the case that the wiring pattern width was set to 85 μm, the deposition of plating was sometimes observed even in Sample 2 to Sample 4, and Sample 6 to Sample 8 in which no plating was deposited in the above test. Further, in the case that the wiring pattern width was set to greater than 100 μm, the deposition of plating was good even in these samples.

With regard to only the deposition of plating, Sample 11 was the most excellent. However, in Sample 11, plating was sometimes deposited also on an unplating portion where plating must not be deposited. This may be caused by the fact that since Ag was substituted for Sn on the surface of the unplating portion, Pd deposited to the plating portion was floated to be deposited to the unplating portion in the step of separating the pattern resist film, so that plating was undesirably deposited to the unplating portion. On the basis of the test results mentioned above, the electrodes 24 and the wiring patterns 25 in this preferred embodiment are formed in accordance with the electrode forming steps for Sample 9. The substrate 21 formed with the channels 22 and the side walls 23 as shown in FIG. 2(B) is first subjected to ultrasonic washing using pure water, so as to remove chips generated in cutting the substrate 21 and make the inside of the channels 22 hydrophilic. Further, ultrasonic washing using an organic solvent such as ethanol is performed. Thereafter, the substrate 21 is enough washed with water and then dried.

Figure 2C:
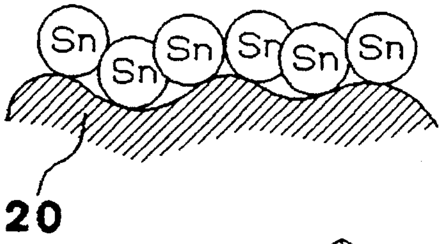
FIG. 2(C) is a schematic view showing a condition where Sn is adsorbed on the surface of a piezoelectric member forming the substrate.
Figure 2D:
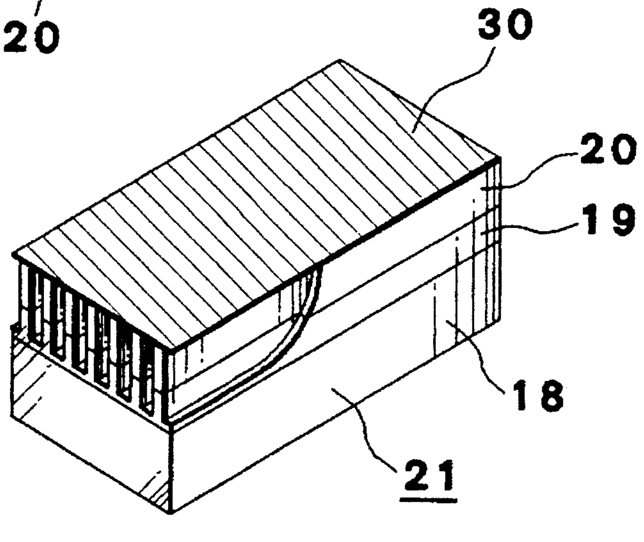
FIG. 2(D) is a perspective view showing a condition where a dry film is attached to the upper surface of the substrate on which the Sn has been adsorbed.

Next, Sn is adsorbed to the whole surface of the piezoelectric members 19 and 20 including the inner surfaces of the channels 22. FIG. 2(C) is a schematic view showing a condition where Sn is adsorbed to the surface of the piezoelectric member 20. Typically, Sn is adsorbed by a method of immersing the substrate 21 into a mixture liquid of $SnF_2$+HF, a mixture liquid of $HBF_4$+$SnF_2$, or a mixture liquid of $SnCl_2$+HCl. In this preferred embodiment, the substrate 21 is immersed into a mixture liquid of $SnF_2$ (0.5 to 5 g/liter)+HF (0.1 to 1 ml/liter) with stirring. After the Sn adsorbing step, the substrate 21 is enough washed with pure water and dried at 120° C. After the drying step, a dry film 30 is attached to the upper surface of the piezoelectric member 20 as shown in FIG. 2(D). The dry film 30 is the same as the dry film 9 mentioned in the prior art.

Figure 3A:
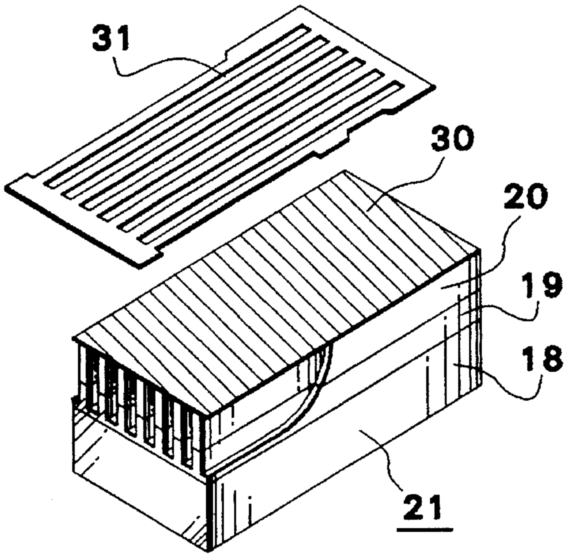
FIG. 3(A) is a perspective view showing the substrate on which the dry film has been attached and a resist mask to be placed on the dry film.
Figure 3C:
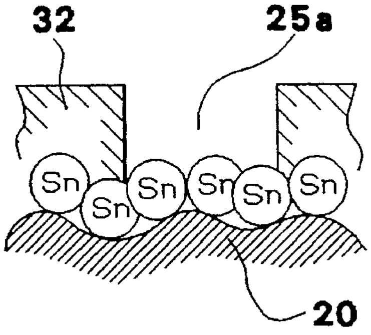
FIG. 3(C) is a schematic view showing a condition where the pattern resist film is formed on the upper surface of the piezoelectric member to which the Sn has been adsorbed.
Figure 3D:
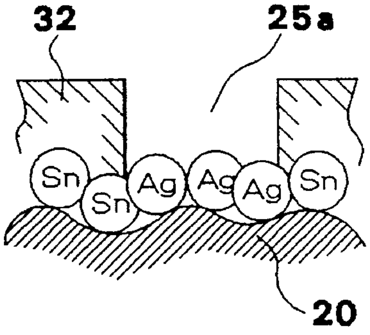
FIG. 3(D) is a schematic view showing a condition where Ag is adsorbed on the surface of the piezoelectric member by a substitution reaction between Sn and Ag.
Figure 3B:
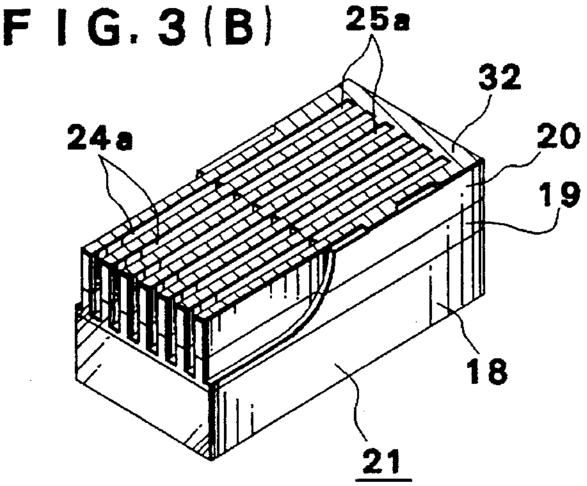
FIG. 3(B) is a perspective view showing a condition where a pattern resist film is formed on the upper surface of the substrate from the dry film.
Figure 8A:
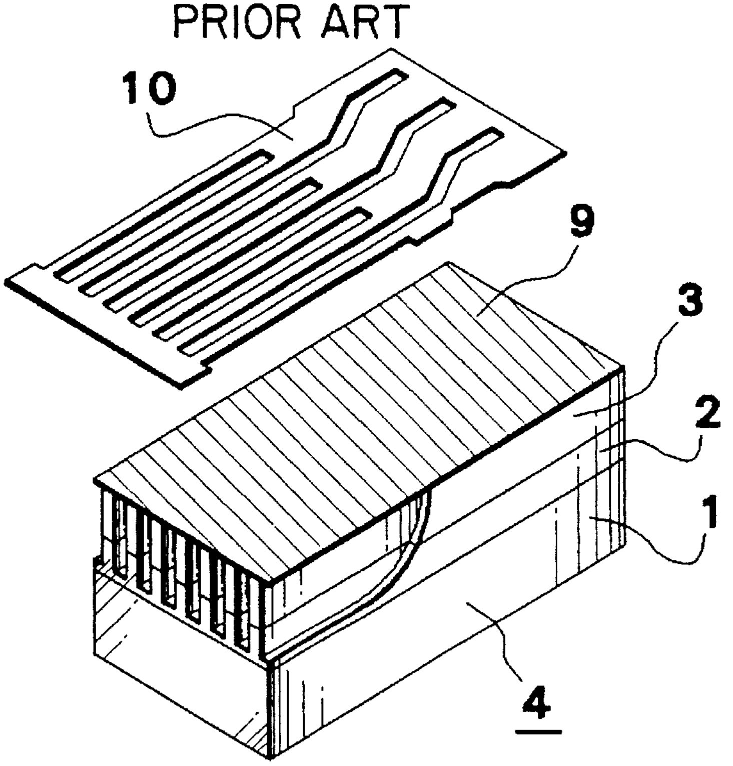
FIG. 8(A) PRIOR ART
FIG. 8(A) is a perspective view showing the substrate to which the dry film has been attached and a resist mask to be placed on the dry film.
Figure 8B:
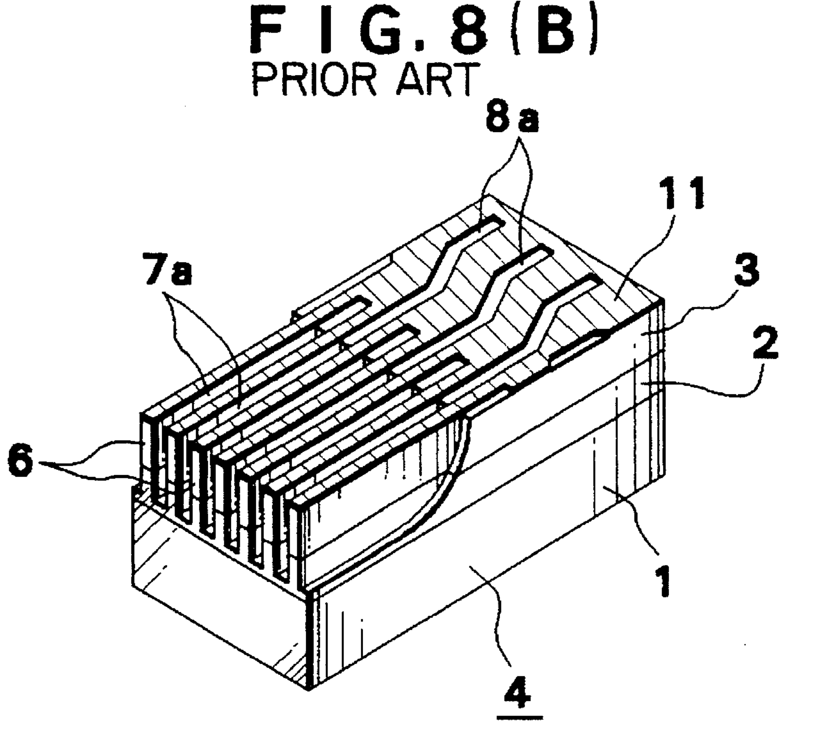
FIG. 8(B) PRIOR ART
FIG. 8(B) is a perspective view showing a condition where a pattern resist film is formed on the upper surface of the substrate from the dry film.
Figure 9A:
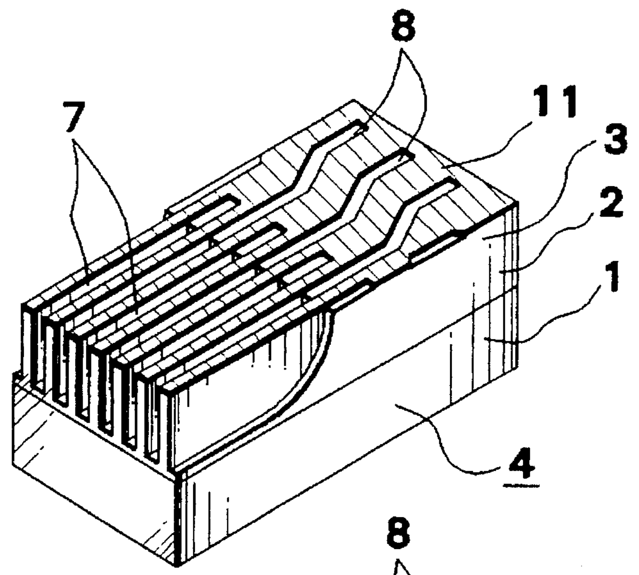
FIG. 9(A) PRIOR ART
FIG. 9(A) is a perspective view showing a condition where wiring patterns and electrodes are formed by electroless plating.
Figure 9B:
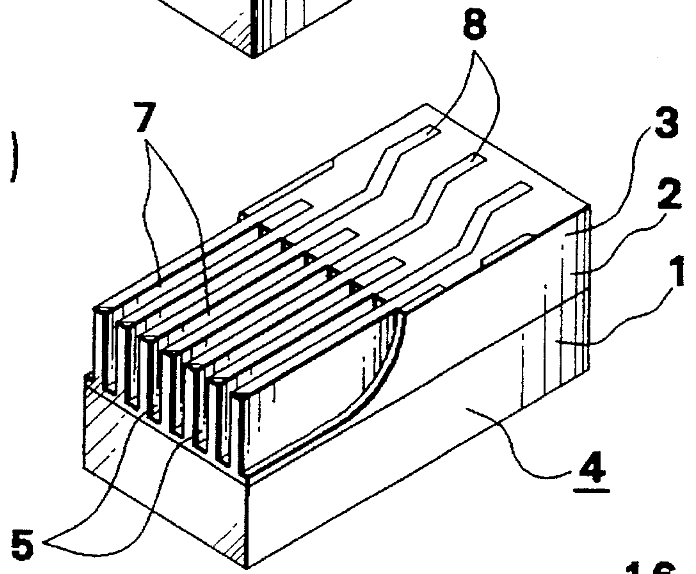
FIG. 9(B) PRIOR ART
FIG. 9(B) is a perspective view showing a condition where the pattern resist film has been separated.
Figure 9C:
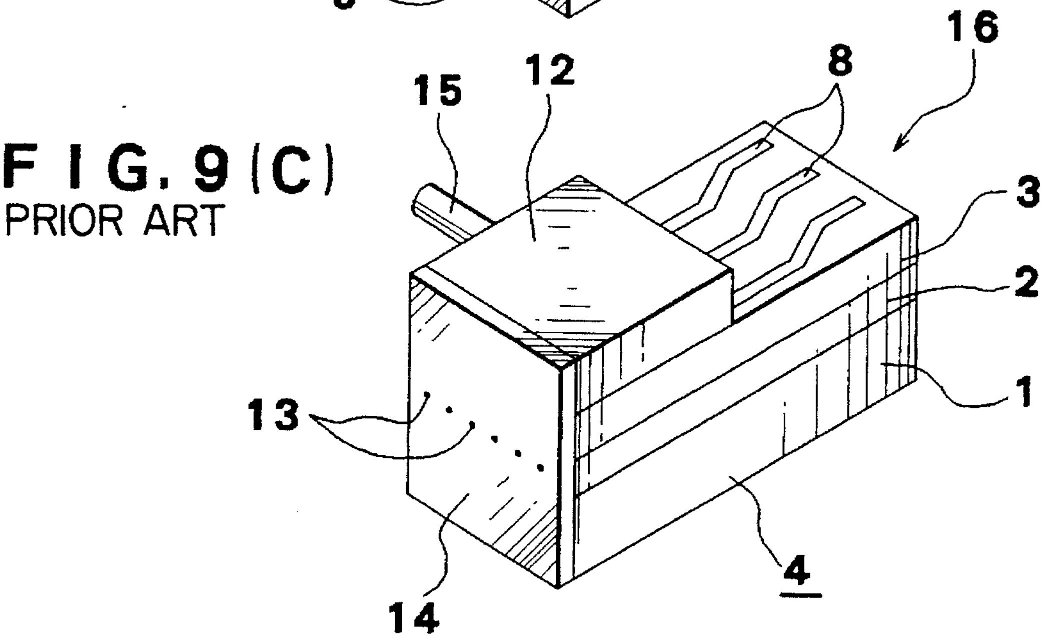
FIG. 9(C) PRIOR ART
FIG. 9(C) is a perspective view showing a condition where a top plate and a nozzle plate are mounted on the substrate to complete the ink jet printer head in the prior art.

Next, a resist mask 31 as shown in FIG. 3(A) is placed on the dry film 30 attached to the upper surface of the piezoelectric member 20 to perform exposure and development. As a result, a pattern resist film 32 as shown in FIG. 3(B) is formed so as to cover a portion of the upper surface of the piezoelectric member 20 except channel inside surfaces **24*a* as electrode forming portions and wiring pattern forming portions 25*a*. FIG. 3(C) is a schematic view showing a condition where the pattern resist film 32 is formed on the upper surface of the piezoelectric member 20 to which Sn has already been adsorbed. In comparing FIG. 3(B) in this preferred embodiment and FIG. 8(B) in the prior art, the two figures are similar to each other in appearance, but they are different in the point that in the substrate 4 shown in FIG. 8(B), metallized Pd as a catalyst core is adsorbed on the surface of the piezoelectric member 3 (including the inner surfaces of the channels 5) by the catalyzing/accelerating process, whereas in the substrate 21 shown in FIG. 3(B), Sn is adsorbed on the surface of the piezoelectric members 19 and 20 (including the inner surfaces of the channels 22**).

After forming the pattern resist film 32 as shown in FIGS. 3(B) and 3(C), the sensitizing process is performed by immersing the substrate 21 having the pattern resist film 32 into a mixture liquid (sensitizing liquid) of $SnF_2$ (0.5 to 5 g/liter)+HF (0.1 to 1 ml/liter) with stirring. By this process, the adsorption of Sn and the etching of the surface of the piezoelectric members 19 and 20 are performed at the channel inside surfaces **24*a* and the wiring pattern forming portions 25*a***.

The purpose of etching the surface of the piezoelectric members 19 and 20 to form a rough surface is to increase a surface area of the surface of the piezoelectric members 19 and 20 to a given surface roughness by etching and thereby obtain strong adhesion of plating, because metal deposited by plating maintains adhesion to a base material by an anchoring effect. The Sn to be adsorbed in this process is overlapped on the Sn already adsorbed on the surface of the piezoelectric members 19 and 20 before attaching the dry film 30. The condition at the time of completion of this process is schematically shown as similarly to FIG. 3(C).

After the sensitizing process, the first stage of activation process is performed by immersing the substrate 21 treated by the sensitizing process into a solution of $AgNO_3$ (1 to 50 g/liter) with stirring. By this process, a substitution reaction between Sn and Ag occurs at the channel inside surfaces 24*a* and the wiring pattern forming portions 25*a* both exposed from the pattern resist film 32. That is, as shown in FIG. 3(D), Ag is adsorbed in substitution for Sn at the channel inside surfaces 24*a* and the wiring pattern forming portions 25*a*.

Figure 3E:
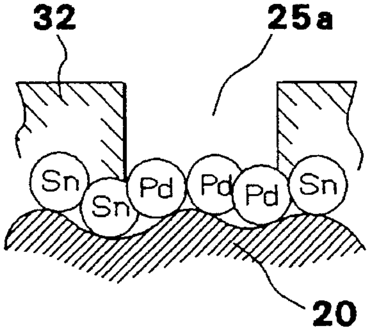
FIG. 3(E) is a schematic view showing a condition where Pd is adsorbed on the surface of the piezoelectric member by a substitution reaction between Ag and Pd.

After the first stage of activation process, the second stage of activation process is performed by immersing the substrate 21 treated by the first stage of activation process into a solution of $PdCl_2$ (0.1 to 1 g/liter)+HCl (0.1 to 1 ml/liter) with stirring. By this process, a substitution reaction between Ag and Pd occurs at the channel inside surfaces 24*a* and the siring pattern forming portions 25*a*. That is, as shown in FIG. 3(E), Pd is adsorbed in substitution for Ag at the channel inside surfaces 24*a* and the wiring pattern forming portions 25*a*.

Figure 4A:
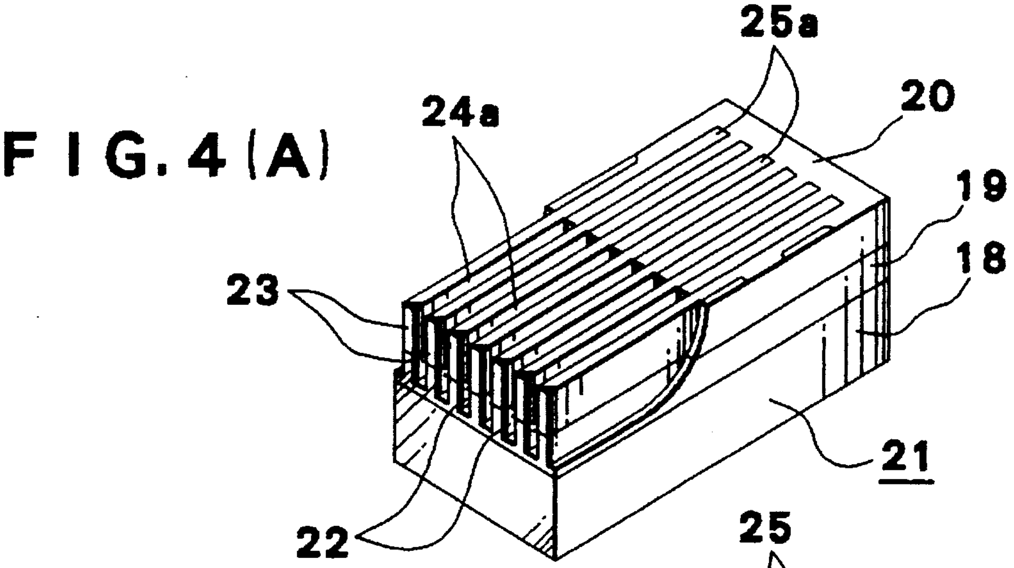
FIG. 4(A) is a perspective view showing a condition where the pattern resist film has been separated.

After the sensitizing/activation process as the pretreatment for electroless plating, the substrate 21 is immersed into an NaOH solution (resist separating liquid) to separate the pattern resist film 32. FIG. 4(A) shows a condition where the pattern resist film 32 has been separated from the substrate 21, in which Pd as a catalyst core for electroless plating is adsorbed at the channel inside surfaces 24*a* and the wiring pattern forming portions 25*a*.

Figure 4B:
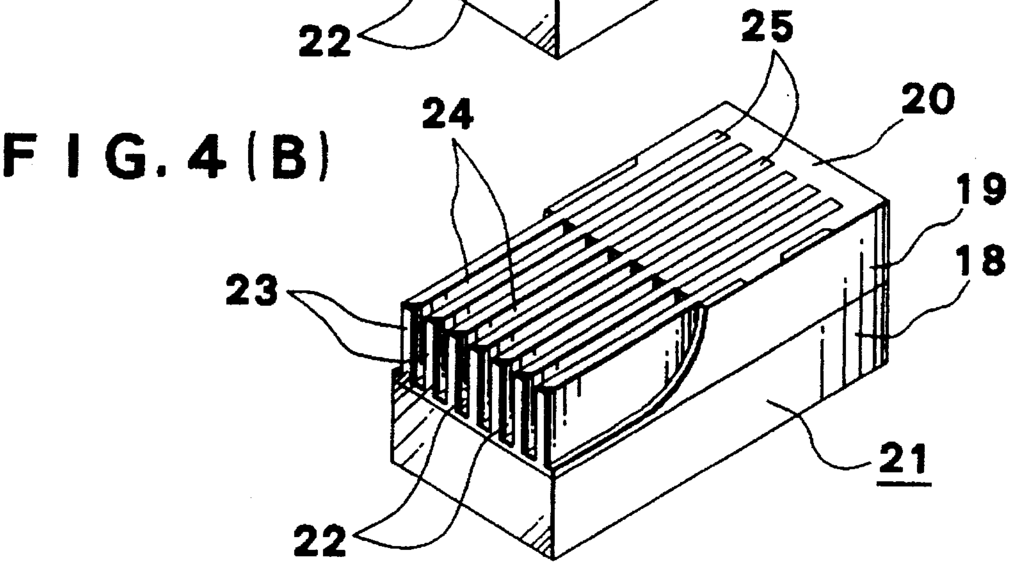
FIG. 4(B) is a perspective view showing a condition where wiring patterns and electrodes are formed by electroless plating.
Figure 4C:
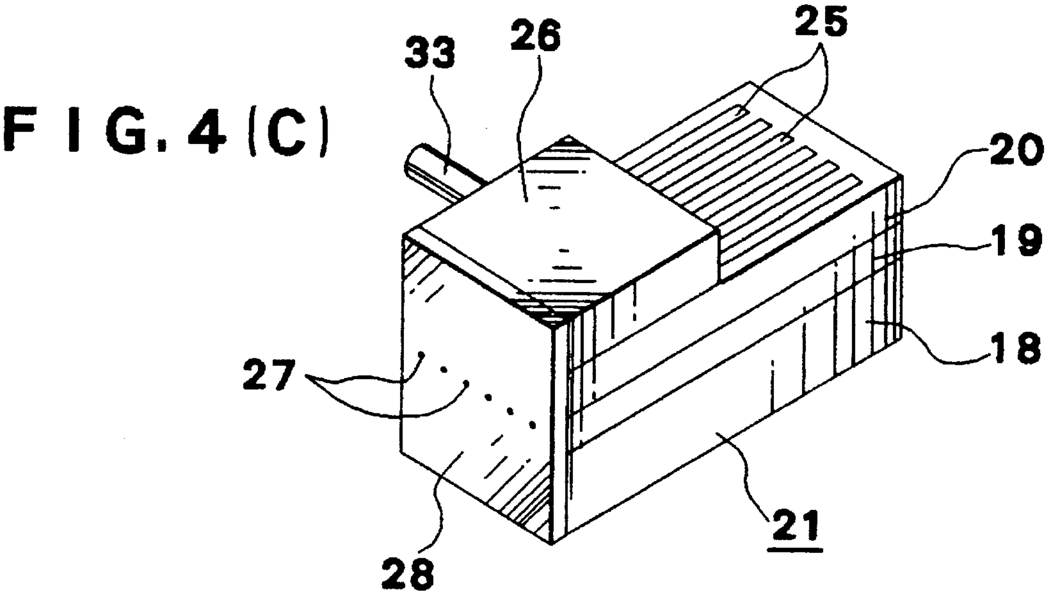
FIG. 4(C) is a perspective view showing a condition where a top plate and a nozzle plate are mounted on the substrate to complete the ink jet printer head.

Next, the electroless plating is performed by immersing the substrate 21, from which the pattern resist film 32 has been separated, into a plating liquid. FIG. 4(B) shows a condition where the electrodes 24 and the wiring patterns 25 have been formed by the electroless plating. By conducting the above-mentioned electrode forming steps, plating is deposited uniformly and efficiently on the channel inside surfaces 24*a* and the wiring pattern forming portions 25*a* having a microscopic structure. Thereafter, the top plate 26 and the nozzle plate 28 are bonded to the substrate 21 on which the electrodes 24 and the wiring patterns 25 have been formed, and an ink supply pipe 33 is mounted to the assembly, thereby completing the ink jet printer head 17 as shown in FIG. 4(C).

A second preferred embodiment of the present invention will now be described with reference to FIGS. 5(A) to 6(D), in which the same parts as those in the first preferred embodiment are denoted by the same reference numerals and the description thereof will be omitted herein. Further, the ink jet printer head in the second preferred embodiment is similar in appearance to the ink jet printer head 17 in the first preferred embodiment shown in FIG. 1, and the manufacturing method for the ink jet printer head is different only in the pretreatment for plating in the electrode forming steps. Therefore, only the pretreatment for plating will be described in this preferred embodiment. The electrode forming steps for Sample 11 are adopted in this preferred embodiment.

Figure 5A:
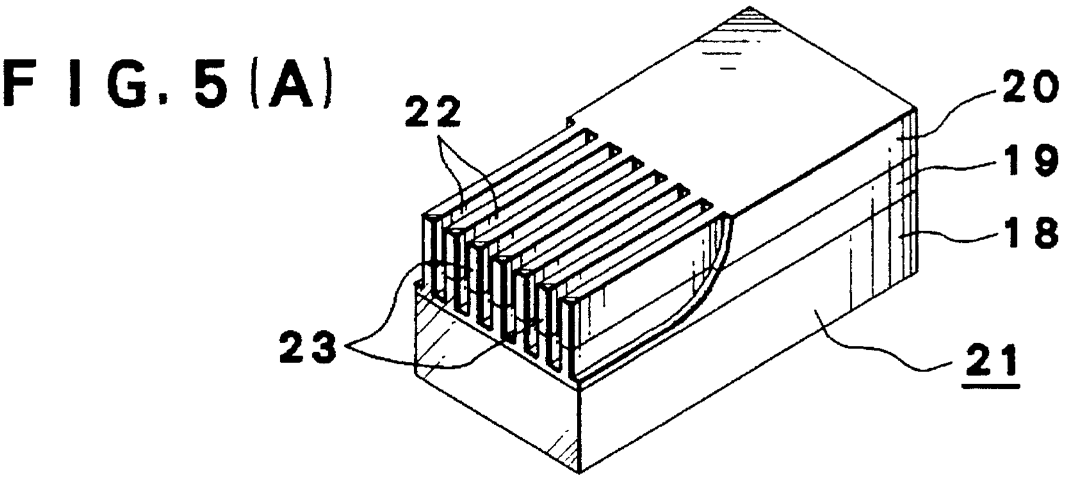
FIG. 5(A) is a perspective view showing a condition where a substrate is cut to form channels in a second preferred embodiment of the present invention.
Figure 5B:
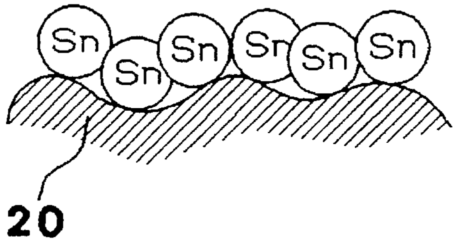
FIG. 5(B)is a schematic view showing a condition where Sn is adsorbed on the surface of a piezoelectric member, forming the substrate.

As shown in FIG. 5(A), a substrate 21 is cut to form channels 22 and side walls 23. Then, Sn is adsorbed to the whole surface of piezoelectric members 19 and 20 including the inner surfaces of the channels 22. FIG. 5(B) is a schematic view showing a condition where Sn is adsorbed on the surface of the piezoelectric member 20. As similarly to the first preferred embodiment, the adsorption of Sn is performed by immersing the substrate 21 into a mixture liquid of $SnF_2$ (0.5 to 5 g/liter)+HF (0.1 to 1 ml/liter) with stirring.

Figure 5C:
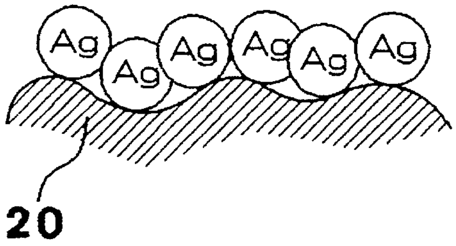
FIG. 5(C) is a schematic view showing a condition where Ag is adsorbed on the surface of the piezoelectric member by a substitution reaction between Sn and Ag.
Figure 5D:
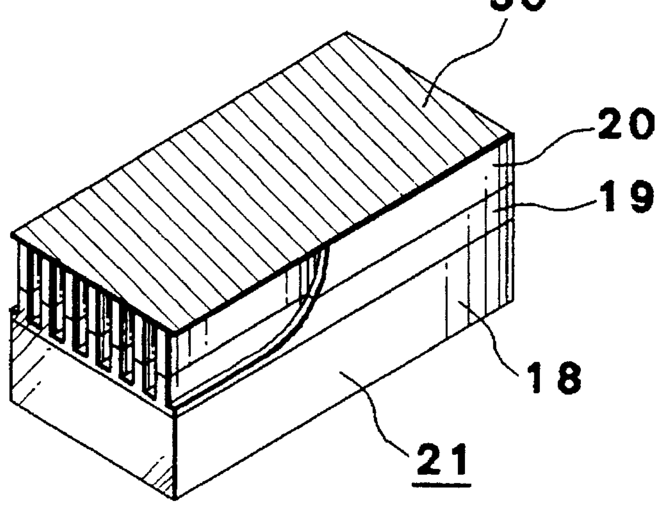
FIG. 5(D) is a perspective view showing a condition where a dry film is attached to the upper surface of the piezoelectric member on which the Ag has been adsorbed.

After adsorbing Sn, the substrate 21 on which Sn has been adsorbed is immersed into a solution of $AgNO_3$ with stirring to produce a substitution reaction between Sn and Ag, thereby adsorbing Ag on the surface of the piezoelectric members 19 and 20. FIG. 5(C) is a schematic view showing a condition where Ag is adsorbed on the surface of the piezoelectric member 20 by the substitution reaction between Sn and Ag. After adsorbing Ag, a dry film 30 is attached to the upper surface of the piezoelectric member 20 as shown in FIG. 5(D).

Figure 6A:
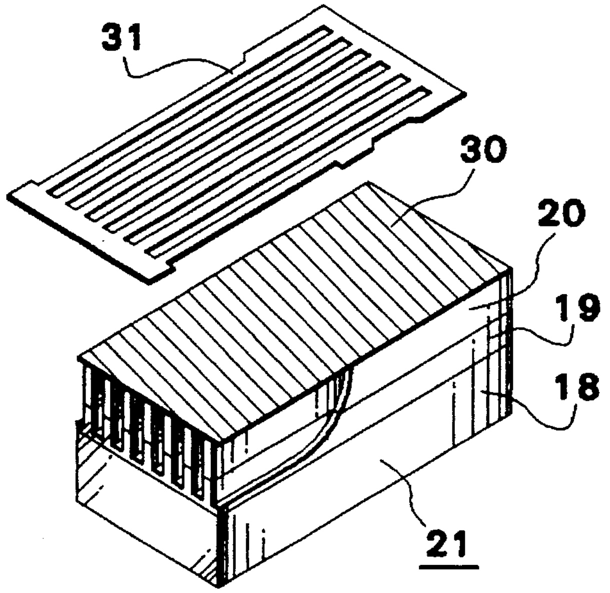
FIG. 6(A)is a perspective view showing the substrate to which the dry film has been attached and a resist film to be placed on the dry film.
Figure 6C:
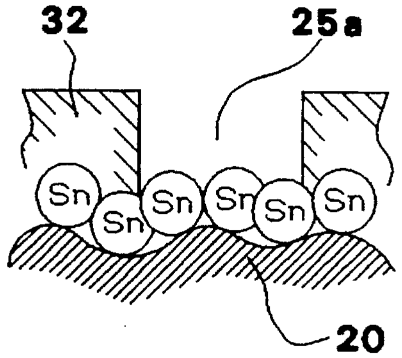
FIG. 6(C) is a schematic view showing a condition where the pattern resist film is formed on the upper surface of the piezoelectric member to which the Ag has been adsorbed.
Figure 6B:
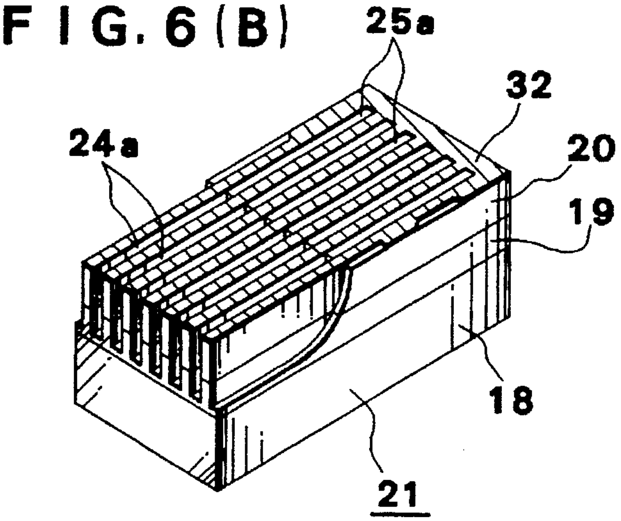
FIG. 6(B) is a perspective view showing a condition where a pattern resist film is formed on the upper surface of the substrate from the dry film.

After attaching the dry film 30, a resist mask 31 as shown in FIG. 6(A) is placed on the dry film 30, and exposure and development are performed to form a pattern resist film 32 as shown in FIG. 6(B). FIG. 6(C) is a schematic view showing a condition where the pattern resist film 32 is formed on the upper surface of the piezoelectric member 20 on which Ag has already been adsorbed.

Figure 6D:
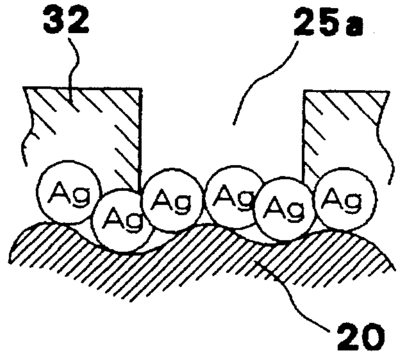
FIG. 6(D) is a schematic view showing a condition where Pd is adsorbed on the surface of the piezoelectric member by a substitution reaction between Ag and Pd.
Figure 7:
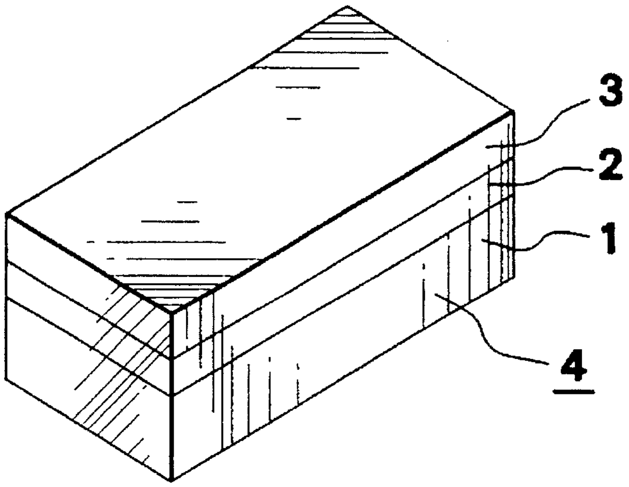
F I G. 7 (A) PRIOR ART
FIG. 7(A) is a perspective view of a substrate in manufacturing an ink jet printer head in the prior art.
FIG. 7(B) is a perspective view showing a condition where the substrate is cut to form channels.
FIG. 7(C) is a perspective view showing a condition where a dry film is attached to the upper surface of the substrate.
Figure 7:
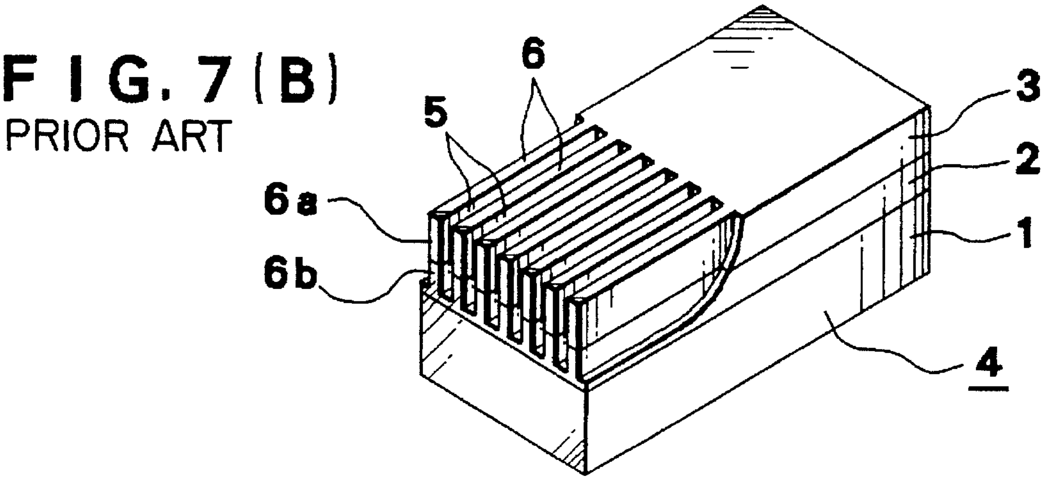
F I G. 7 (B) PRIOR ART
Figure 7:
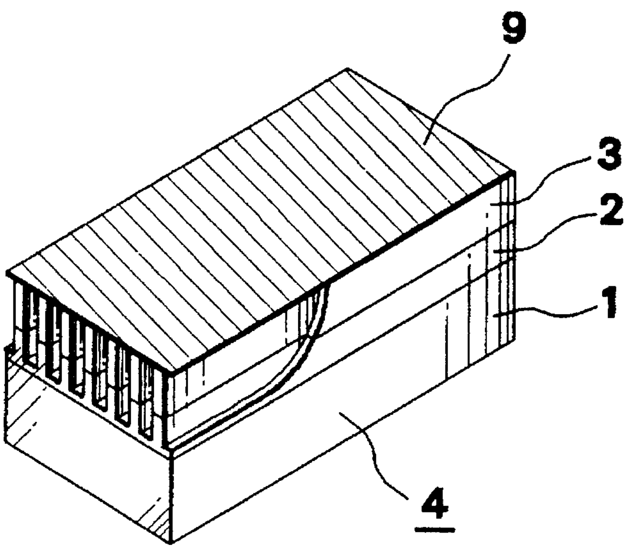
F I G. 7 (C) PRIOR ART

Next, only the second stage of activation process is performed by immersing the substrate 21 having the pattern resist film 32 into a solution of $PdCl_2$ (0.1 to 1 g/liter)+HCl (0.1 to 1 ml/liter) with stirring. By this process, a substitution reaction between Ag and Pd occurs at channels inside surfaces 24*a* and wiring pattern forming portions 25*a*. That is, as shown in FIG. 6(D), Pd as a catalyst core for electroless plating is adsorbed at the channel inside surfaces 24*a* and the wiring pattern forming portions 25*a*. After adsorbing Pd, the pattern resist film 32 is separated from the substrate 21, and the substrate 21 is immersed into a plating liquid to perform electroless plating.

According to the second preferred embodiment, prior to the attachment of the dry film 30, the adsorption of Sn and the adsorption of Ag by substitution for Sn are performed. Accordingly, as compared with the first preferred embodiment wherein Ag is substituted for Sn after forming the pattern resist film 32, the adsorption of Ag is better effected in the second preferred embodiment. As a result, the adsorption of Pd by substitution for Ag is better effected. Accordingly, the deposition of plating with Pd acting as a catalyst core can be effected more uniformly and better.

While the substrate 21 is formed by bonding the two layers of piezoelectric members 19 and 20 to the bottom plate 18 in the above preferred embodiments, the substrate employable in the present invention may be any substrate formed by layering at least one piezoelectric member on a bottom plate. For example, the present invention may adopt the substrate 4 composed of the bottom plate 1, the lower layer 2, and the piezoelectric member 3 as mentioned in the prior art, or a substrate formed by bonding a piezoelectric member to a bottom plate and forming an upper layer of a resin material on the piezoelectric member. Further, it is to be noted that the present invention is not limited to the above two preferred embodiments, but embraces all modifications and changes within the scope of the present invention.

What is claimed is:

1. A manufacturing method for an ink jet printer head, comprising the steps of:

(A) forming a substrate composed of a plurality of layers including at least one piezoelectric member polarized across its thickness;

(B) forming a plurality of parallel channels and a plurality of side walls isolating said channels at given intervals, from an upper surface of said substrate, at least a part of each of said side walls being formed from said piezoelectric member;

(C) adsorbing Sn on the upper surface of said substrate including inner surfaces of said channels;

(D) forming a pattern resist film on the upper surface of said substrate on which said Sn has been adsorbed so that said pattern resist film covers a portion of the upper surface of said substrate except electrode forming portions on the inner surfaces of said channels and wiring pattern forming portions on the substrate;

(E) adsorbing Pd as a catalyst core for electroless plating on said electrode forming portions and said wiring pattern forming portions;

(F) separating said pattern resist film;

(G) immersing said substrate from which said pattern resist film has been separated into a plating liquid to deposit plating on said electrode forming portions and said wiring pattern forming portions, thereby forming electrodes and wiring patterns; and (H) mounting on said substrate a top plate for covering upper openings of said channels and a nozzle plate for covering front openings of said channels to form a plurality of ink chambers.

2. A manufacturing method for an ink jet printer head as recited in claim 1, wherein said step (C) comprises a sensitizing process of immersing said substrate into a sensitizing liquid.

3. A manufacturing method for an ink jet printer head as recited in claim 2, wherein said sensitizing liquid is a mixture liquid of $SnF_2$+HF.

4. A manufacturing method for an ink jet printer head as recited in claim 2, wherein said sensitizing liquid is a mixture liquid of $HBF_4$+$SnF_2$.

5. A manufacturing method for an ink jet printer head as recited in claim 2, wherein said sensitizing liquid is a mixture liquid of $SnCl_2$+HCl.

6. A manufacturing method for an ink jet printer head as recited in claim 1, wherein said step (E) comprises an activation process comprising a first stage of process of substituting Ag for said Sn adsorbed on said electrode forming portions and said wiring pattern forming portions, and a second stage of process of substituting said Pd for said Ag.

7. A manufacturing method for an ink jet printer head as recited in claim 6, wherein said first stage of process comprises immersing said substrate on which said Sn has been adsorbed into a solution of $AgNO_3$.

8. A manufacturing method for an ink jet printer head as recited in claim 6, wherein said second stage of process comprises immersing said substrate treated by said first stage of process into a solution of $PdCl_2$+HCl.

9. A manufacturing method for an ink jet printer head as recited in claim 1, wherein said step (C) further comprises a process of substituting Ag for said Sn.

10. A manufacturing method for an ink jet printer head as recited in claim 9, wherein said step (E) comprises a process of substituting said Pd for said Ag.

* * * * *